United States Patent
Onishi et al.

(10) Patent No.: US 8,466,717 B2
(45) Date of Patent: Jun. 18, 2013

(54) FREQUENCY SYNTHESIZER

(75) Inventors: Naoki Onishi, Sayama (JP); Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 120 days.

(21) Appl. No.: 12/998,086

(22) PCT Filed: Sep. 30, 2009

(86) PCT No.: PCT/JP2009/005053
§ 371 (c)(1),
(2), (4) Date: Mar. 16, 2011

(87) PCT Pub. No.: WO2010/038456
PCT Pub. Date: Apr. 8, 2010

(65) Prior Publication Data
US 2011/0169533 A1 Jul. 14, 2011

(30) Foreign Application Priority Data
Oct. 2, 2008 (JP) ................................ 2008-257768

(51) Int. Cl.
*H03B 21/00* (2006.01)
(52) U.S. Cl.
USPC ............... 327/105; 331/1 R; 331/34; 327/113
(58) Field of Classification Search
USPC ...................................... 327/105; 331/1 R, 34
See application file for complete search history.

(56) References Cited

U.S. PATENT DOCUMENTS

| 4,789,996 A | | 12/1988 | Butcher | |
|---|---|---|---|---|
| 5,444,420 A | * | 8/1995 | Wernlund | ...................... 331/1 R |
| 5,539,346 A | * | 7/1996 | Goto | ............................ 327/156 |

(Continued)

FOREIGN PATENT DOCUMENTS

| CN | 1 693 967 | 8/2006 |
|---|---|---|
| CN | 1815892 | 8/2006 |

(Continued)

*Primary Examiner* — Ryan Jager
(74) *Attorney, Agent, or Firm* — Jordan and Hamburg LLP

(57) ABSTRACT

The provision of a technique capable of determining a state where PLL control does not operate normally instantly or in advance in a frequency synthesizer that frequency-divides, A/D converts, and quadranture-detects a frequency signal from a voltage controlled oscillating unit, and extracts a rotation vector rotating at a frequency difference between the frequency signal used for the detection and the A/D converted frequency signal, and integrates a difference between a frequency of the above rotation vector and a set frequency to set an integration result as a control voltage to the voltage controlled oscillating unit. The control voltage to be input to the voltage controlled oscillating unit is monitored, and it is determined whether or not a level of the monitored control voltage deviates from a set range determined in advance, and an unlock detection signal is output. In a structure in which the rotation vector is multiplied by a reverse rotation vector reversely rotating at a frequency determined in rough increments according to the set frequency to reduce a velocity of the rotation vector, a determination result whether or not a length of the rotation vector whose velocity is reduced (a scalar quantity) or a correction signal for gain control deviates from a range set in advance is further considered.

4 Claims, 4 Drawing Sheets

U.S. PATENT DOCUMENTS

| | | | |
|---|---|---|---|
| 5,872,486 A * | 2/1999 | Wagner et al. | 331/1 A |
| 6,252,464 B1 * | 6/2001 | Richards et al. | 331/4 |
| 7,764,207 B2 * | 7/2010 | Kobata et al. | 341/110 |
| 7,888,974 B2 * | 2/2011 | Kobata et al. | 327/105 |
| 2002/0084856 A1 * | 7/2002 | Von Dolteren, Jr. | 331/1 A |
| 2007/0081610 A1 * | 4/2007 | Krivokapic et al. | 375/302 |
| 2007/0103239 A1 | 5/2007 | Saeki | |
| 2008/0007353 A1 * | 1/2008 | Kobata | 331/25 |
| 2009/0167367 A1 * | 7/2009 | Kobata et al. | 327/105 |
| 2011/0140760 A1 * | 6/2011 | Krivokapic et al. | 327/360 |

FOREIGN PATENT DOCUMENTS

| | | |
|---|---|---|
| CN | 101098141 | 1/2008 |
| JP | 5-227017 | 9/1993 |
| JP | 6-164381 | 6/1994 |
| JP | 11-317663 | 11/1999 |
| JP | 2006-180349 | 7/2006 |
| JP | 2007-158472 | 6/2007 |
| JP | 2008-035483 | 2/2008 |

* cited by examiner

Fig.6

| | AGC DETERMINATION | |
|---|---|---|
| LEVEL DETERMINATION | H | L |
| H | LOCK | UNLOCK |
| L | UNLOCK | UNLOCK |

FREQUENCY SYNTHESIZER

TECHNICAL FIELD

The present invention relates to a technique capable of quickly detecting that a PLL lock is unlocked in a frequency synthesizer capable of obtaining an oscillation output with a desired frequency.

BACKGROUND ART

As one of standard signal generators, there is a frequency synthesizer to which a PLL (Phase Locked Loop) is applied. In Patent Document 1, there has been described a frequency synthesizer that frequency-divides, analog/digital (A/D) converts, and quadranture-detects a frequency signal from a voltage controlled oscillating unit, and extracts a rotation vector rotating at a frequency difference between the frequency signal used for the detection and the (A/D) converted frequency signal, and integrates a signal corresponding to a difference between a frequency of the above rotation vector and a set frequency to set an integration result as a control voltage to the voltage controlled oscillating unit to thereby establish a PLL loop. In the above method, in order to stop the above-described rotation vector, the rotation vector is multiplied by a reverse rotation vector reversely rotating at a frequency determined in rough increments according to the set frequency to reduce a velocity of the vector, and a phase difference between the vectors whose velocities are reduced in each sampling time is detected, and the above phase difference is assumed to be the velocity of the vector, and the loop is operated so that the phase difference becomes zero.

The above frequency synthesizer has been used in a base station, a relay station, and the like, and when a PLL lock is unlocked to be in an unlock state, a countermeasure such that the frequency synthesizer is quickly switched to a system on a redundant side is required. Thus, in Patent Document 1, the frequency synthesizer is designed so as to monitor a scalar quantity of the vector whose velocity is reduced, and compare the above scalar quantity and a desired value determined in advance, and multiply an output of an A/D converter by a correction gain signal corresponding to a difference between the scalar quantity and the desired value, and correct a gain of the output signal to thereby suppress the above-described scalar quantity to a predetermined value. Then, the frequency synthesizer is designed so as to output an unlock detection signal when the above-described scalar quantity or the above-described correction gain signal deviates from a set range determined in advance.

However, the change in an input level to the A/D converter is detected after an arithmetic operation step of the above-described rotation vector and a multiplication step of the reverse vector, and these detection operations are performed intermittently by a clock, and thereby the determination is delayed by the amount of time for the arithmetic operation of a digital signal, resulting that it has been difficult to say that a request for instantly detecting the unlock state is sufficiently satisfied.

[Patent Document 1] Japanese Patent Application Laid-open No. 2008-35483

DISCLOSURE OF THE INVENTION

The present invention has been made under such circumstances, and has an object to provide a technique that, in a frequency synthesizer using PLL control, is capable of determining a state where the PLL control does not operate normally instantly or in advance.

The present invention being a frequency synthesizer that frequency-divides a frequency signal output from a voltage controlled oscillating unit depending on a control voltage, and digitizes a sinusoidal signal being the frequency-divided frequency signal via an analog/digital converting unit, and quadranture-detects the digitized frequency signal by a frequency signal for detection that is a digital signal, and extracts a real part and an imaginary part of complex expression of a vector rotating at a frequency corresponding to a frequency difference between both the frequency signals in a vector extracting means, and integrates a frequency difference between a frequency of the vector when an output frequency of the voltage controlled oscillating unit becomes a set frequency and a frequency of a vector extracted in the vector extracting means to supply an integration result as the control voltage to the voltage controlled oscillating unit via a digital/analog converting unit, the present invention includes:

a monitoring means monitoring the control voltage to be input to the voltage controlled oscillating unit; and a means determining whether or not a level of the control voltage monitored by the monitoring means deviates from a set range determined in advance and outputting an unlock detection signal when the level deviates from the set range.

A frequency dividing means also includes the case of N=1, and in the above case, a frequency divider is not used in the actual device, and a conductive path between an output end of the voltage controlled oscillating unit and an input end of the analog/digital converting unit corresponds to the frequency dividing means in the present invention. In the present invention as above, in order to make the description of the claims understandable, even in the case of N=1, the structure of the frequency dividing means is described.

The present invention may also be structured in the following form.

The monitoring means monitors a signal level of an input signal to the analog/digital converting unit instead of monitoring the control voltage, and the means outputting the unlock detection signal determines whether or not the level of the input signal deviates from a set range determined in advance instead of determining whether or not the level of the control voltage deviates from the set range determined in advance.

A frequency pull-in means, when a PLL is locked and then the PLL is unlocked, adding a frequency pull-in voltage to an analog voltage from the digital/analog converting unit to supply an addition result as the control voltage to the voltage controlled oscillating unit is included, and the monitoring means monitors the frequency pull-in voltage instead of monitoring the control voltage; and the means outputting the unlock detection signal determines whether or not a level of the frequency pull-in voltage deviates from a set range determined in advance instead of determining whether or not the level of the control voltage deviates from the set range determined in advance.

A frequency difference extracting means includes: a means multiplying the vector extracted in the vector extracting means by a reverse rotation vector reversely rotating at a frequency determined in rough increments according to the set frequency; a phase difference detecting unit detecting a phase difference between the vectors whose velocities are reduced by the above means in each sampling time; and a means extracting a difference between a phase difference between vectors rotating at a frequency equal to a difference between the frequency determined in rough increments and the set frequency in each sampling time and the phase difference detected in the phase difference detecting unit, and a vector detecting means detecting a length of the vector whose velocity is reduced, and a means outputting a correction signal for gain control based on the length of the vector detected in the vector detecting means, and a multiplying means positioned on a subsequent stage of the analog/digital converting unit and multiplying the signal that is not yet quadranture-detected by the correction signal for gain control, and a means outputting an abnormal signal when the detected length of the vector or the correction signal for gain control deviates from a range set in advance are further included, and the means outputting the unlock detection signal is structured so as to output the unlock detection signal when at least one of a state where the control voltage or the level of the signal that is monitored by the monitoring means deviates from the set range determined in advance and a state where the abnormal signal is output occurs.

The present invention being the frequency synthesizer that frequency-divides, A/D converts, and quadranture-detects the frequency signal from the voltage controlled oscillating unit, and extracts the rotation vector rotating at the frequency difference between the frequency signal used for the detection and the (A/D) converted frequency signal, and integrates the difference between the frequency of the above rotation vector and the set frequency to set the integration result as the control voltage to the voltage controlled oscillating unit, is designed so as to monitor the control voltage to be input to the voltage controlled oscillating unit and determine whether or not the level of the monitored control voltage deviates from the set range determined in advance to output the unlock detection signal, so that it is possible to detect that the PLL is unlocked instantly or in advance.

Further, according to the method of monitoring the signal level of the input signal to the above-described A/D converting unit instead of monitoring the level of the control voltage, the unlock state can be detected instantly. Further, in the structure in which the frequency pull-in means that, when the PLL is locked and then the PLL is unlocked, adds the frequency pull-in voltage to the analog voltage from the above-described A/D converting unit to supply the addition result as the control voltage to the voltage controlled oscillating unit is provided, monitoring the frequency pull-in voltage also makes it possible to detect the unlock state instantly.

Then, according to another invention, in the structure in which the rotation vector is multiplied by the reverse rotation vector reversely rotating at the frequency determined in rough increments according to the set frequency to reduce the velocity of the rotation vector, a determination result whether or not the length of the rotation vector whose velocity is reduced (a scalar quantity) or the correction signal for gain control deviates from the range set in advance is further considered, so that it is possible to detect the unlock state instantly or in advance, and further securely.

BRIEF DESCRIPTION OF DRAWINGS

FIG. 6 is a characteristic chart illustrating a relation between a control voltage to be input to a voltage controlled oscillating unit and an output frequency.

BEST MODE FOR CARRYING OUT THE INVENTION

Figure 1:
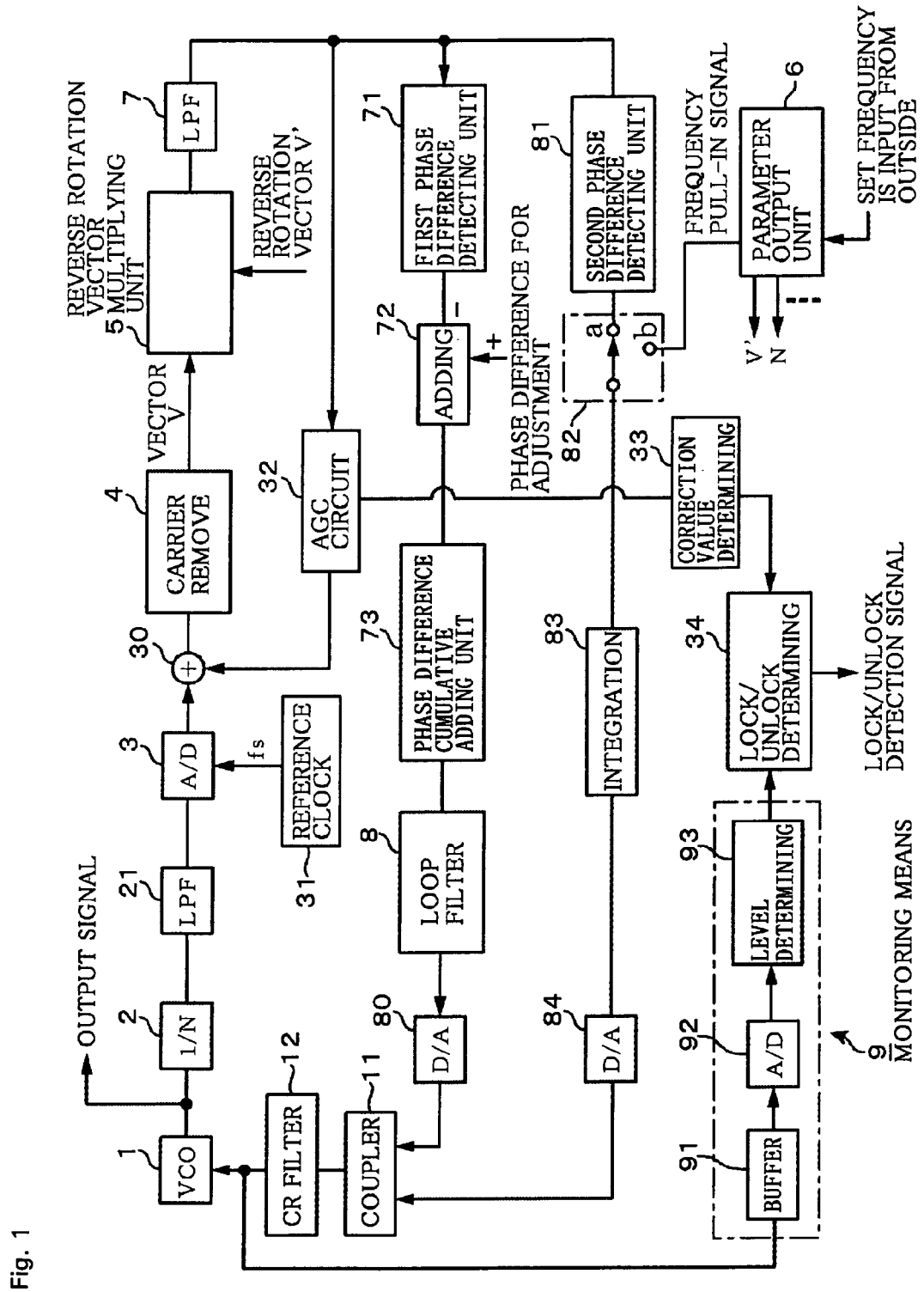
FIG. 1 is a block diagram illustrating an embodiment of a frequency synthesizer according to the present invention.

FIG. 1 illustrates an entire structure of an embodiment of a frequency synthesizer of the present invention. 1 denotes a voltage controlled oscillating unit (VCO), which outputs a frequency signal with a frequency that depends on a control voltage to be input. 2 denotes a frequency divider being a frequency dividing means, which frequency-divides the frequency signal from the voltage controlled oscillating unit 1 at a frequency divider ratio depending on a set frequency. 21 denotes a low-pass filter, which filters a high frequency of the frequency signal from the frequency divider 2. 3 denotes an analog/digital (A/D) converting unit, which A/D converts a sinusoidal signal being the frequency signal that is frequency-divided in the frequency divider 2. Concretely, the above A/D converting unit 3 samples the above-described sinusoidal signal by a clock signal from a reference clock generating unit 31 to output a sampling value as a digital signal.

On a subsequent stage of the A/D converting unit 3, a carrier remove 4 is provided via a multiplying unit 30 that will be described in detail later. The above carrier remove 4 corresponds to a means quadrature-detecting the sinusoidal signal specified by the digital signal from the A/D converting unit 3 by a sinusoidal signal (signal for detection) whose frequency is ω0t/2π (angular velocity is ω0t) and extracting a vector rotating at a frequency equal to a difference between the frequency of the frequency signal specified by the digital signal of the A/D converting unit 3 and the frequency of the sinusoidal signal used for the detection, more specifically, corresponds to a means extracting a real part and an imaginary part of complex expression of the above vector.

Figure 2:
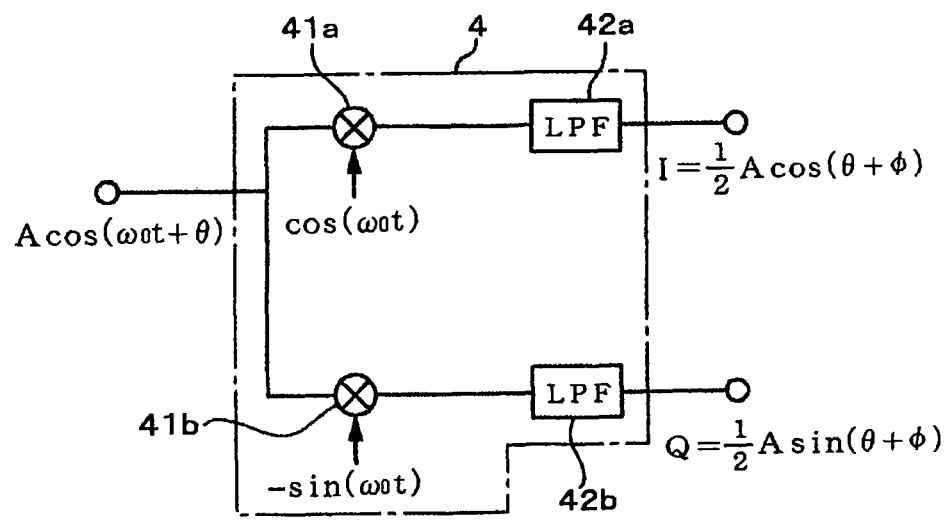
FIG. 2 is a configuration diagram illustrating a carrier remove used in the above-described embodiment.

FIG. 2 illustrates a configuration of the carrier remove 4, and an output of a multiplying section 41a and an output of a multiplying section 41b are expressed by an expression (1) and an expression (2) respectively, where A cos (ω0t+0) is the sinusoidal signal obtained in the A/D converting unit 3.

$$A \cos(\omega 0t+\theta) \cdot \cos(\omega 0t) = \frac{1}{2} \cdot A \cos\theta + \frac{1}{2}\{\cos(2\omega 0t) \cdot \cos\theta + \sin(2\omega 0t) \cdot \sin\theta\} \quad (1)$$

$$A \cos(\omega 0t+\theta) - \sin(\omega 0t) = \frac{1}{2} \cdot A \sin\theta - \frac{1}{2}\{\sin(2\omega 0t) \cdot \cos\theta + \cos(2\omega 0t) \cdot \sin\theta\} \quad (1)$$

Figure 3:
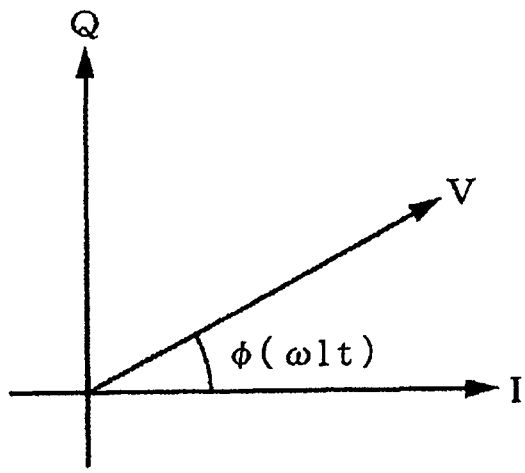
FIG. 3 is an explanatory chart illustrating a vector obtained in the carrier remove.

Then, after the output of the multiplying section 41a and the output of the multiplying section 41b pass through low-pass filters 42a and 42b respectively, a frequency signal of 2ω0t is removed, so that ½Acos θ and ½·Asin θ are extracted from the low-pass filters 42a, 42b respectively. FIG. 3 is a chart illustrating a vector V extracted in this manner, and a length of the above vector V is A, and its rotation velocity is ω1t (=φ) (its frequency is ω1t/2π).

On a subsequent stage of the carrier remove 4, a reverse rotation vector multiplying unit 5, a low-pass filter (LFP) 7, a first phase difference detecting unit 71, and an adding unit 72 are provided in this order. Their roles will be explained briefly. The above frequency synthesizer is designed so as to integrate a frequency difference between a frequency of the above-described rotation vector V when the output frequency of the voltage controlled oscillating unit 1 becomes the set frequency and the frequency of the rotation vector V extracted in the carrier remove 4 to supply the control voltage depending on an integral value to the voltage controlled oscillating unit 1. Such a loop constitutes a PLL, and as the output frequency of the voltage controlled oscillating unit 1 comes closer to the set frequency, the above-described frequency difference becomes smaller, and when both the frequencies agree with each other, the frequency difference becomes zero. The frequency of the above-described rotation vector V when the output frequency becomes the set frequency is calculated in a parameter output unit 6 in advance. It is only necessary that such an operation is performed in a manner to multiply a reverse rotation vector V' rotating reversely to the rotation vector V at the calculated frequency and the rotation vector V obtained in the carrier remove 4 together, but if the operation is performed in this manner, a data volume of the reverse rotation vector V' becomes enormous. Thus, the rotation vector V is multiplied by the reverse rotation vector V' reversely rotating at a frequency determined in rough increments according to the set frequency in the reverse rotation vector multiplying unit 5, and the rotation vector V whose velocity is reduced thereby is stopped in the first phase difference detecting unit 71 and the adding unit 72 on the subsequent stage.

The arithmetic operation in the reverse vector multiplying unit 5 will be explained. The carrier remove 4 and the reverse vector multiplying unit 5 are executed by the arithmetic operation of a computer, and assuming that a sampling value of the vector V in a sampling at a certain timing, for example, in an n-th sampling in the sampling of the arithmetic operation is $I(n)+jQ(n)$, an n-th sampling value of the reverse vector V' is $I'(n)+jQ'(n)$. A vector $I+jQ$ being the result of the multiplication of the both vectors is $\{I(n)+jQ(n)\}\times\{I'(n)+jQ'(n)\}$. Summarizing the above expression gives an expression (3).

$$I+jQ=\{I(n)\cdot I'(n)-Q(n)\cdot Q'(n)\}+j\{I(n)\cdot Q'(n)+I'(n)\cdot Q(n)\} \quad (3)$$

That the reverse vector V' is generated actually means that values of the real part and the imaginary part of the vector, that is, values of $\cos \phi'$ and $\sin \phi'$ are generated so that the vector reversely rotates on a complex plane, $\phi'$ being a phase of the reverse vector V'. More concretely, a table in which pairs of $\cos \phi'$ and $\sin \phi'$ of the vector are arranged in order along a rotation direction of the vector is prepared in, for example, the parameter output unit 6, and an address of the table is read out by an increment number or a decrement number determined according to the designated set frequency of the voltage controlled oscillating unit 1, and in this manner, the generation can be achieved.

Figure 4:
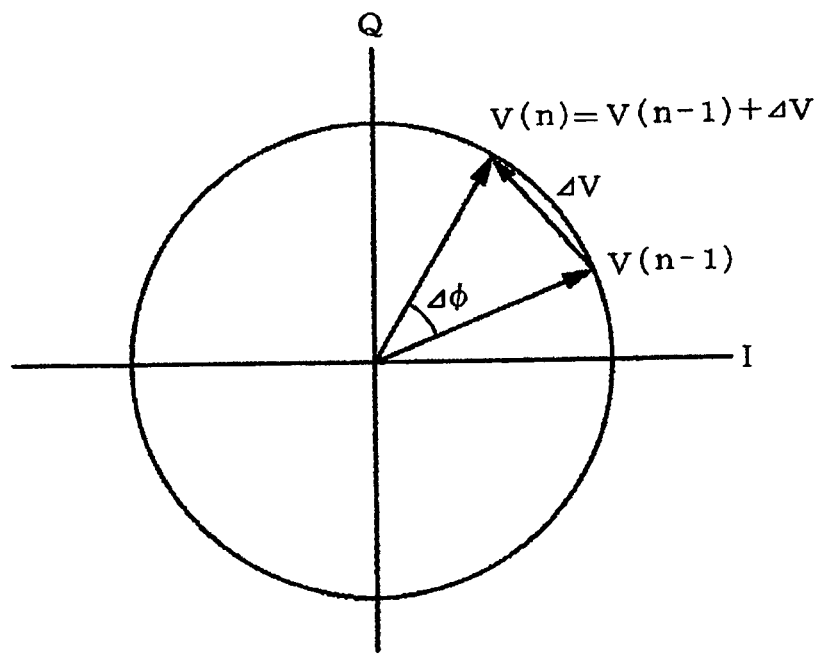
FIG. 4 is an explanatory chart illustrating a phase difference between vectors sampled at consecutive timings.

Since the rotation velocity of the vector V has been reduced by the reverse vector V' in this manner, the frequency (velocity) of the vector V can be obtained by a simple approximate expression. As illustrated in FIG. 4, on a complex plane, an angle $\Delta\phi$ made by a vector $V(n-1)$ obtained by an $(n-1)$-th sampling and a vector $V(n)=V(n-1)+\Delta V$ obtained by an n-th sampling, that is, a phase difference $\Delta\phi$ between the vectors V obtained by the both samplings can be regarded as a length of $\Delta V$ if the frequency of the vector V is sufficiently smaller than a sampling frequency and $\theta=\sin \theta$ roughly holds.

The approximate expression for obtaining $\Delta V$ will be explained. First, the phase difference $\Delta\phi$ is expressed by an expression (4). Incidentally, imag is an imaginary part, conj$\{V(n)\}$ is a conjugate vector of $V(n)$, and K is a constant.

$$\Delta\phi = K \cdot \text{imag}[\Delta V \cdot \text{conj}\{V(n)\}] \quad (4)$$

Here, if an I value (a real part of the vector V) and a Q value (an imaginary part of the vector V) corresponding to the n-th sampling are $I(n)$ and $Q(n)$ respectively, $\Delta V$ and conj $\{V(n)\}$ in the complex expression are expressed by an expression (5) and an expression (6) respectively.

$$\Delta V = \Delta I + j\Delta Q \quad (5)$$

$$\text{conj}\{V(n)\} = I(n) - jQ(n) \quad (6)$$

However, $\Delta I$ is $I(n)-I(n-1)$ and $\Delta Q$ is $Q(n)-Q(n-1)$. As a result of substituting the expression (5) and the expression (6) in the expression (4) and summarizing the expression, $\Delta\phi$ is expressed by an expression (7).

$$\Delta\phi = \Delta Q \cdot I(n) - \Delta I \cdot Q(n) \quad (7)$$

The above-described first phase difference detecting unit 71 is thus provided with a function of obtaining $\Delta\phi$ by using the approximate expression. This $\Delta\phi$ is a value corresponding to the frequency of the vector V whose velocity is reduced in the reverse vector multiplying unit 5.

Here, the parameter output unit 6 has a set frequency input thereto from the outside, and further also finds the frequency determined in rough increments according to the set frequency, that is, a velocity (frequency) of the reverse rotation vector V', so that the parameter output unit 6 also finds the value of the frequency ($\Delta\phi$) of the vector V obtained from the second phase difference detecting unit 71 in advance when the output frequency in the voltage controlled oscillating unit 1 becomes the set frequency. Assuming that the above value is called a frequency fine adjustment amount, in the adding unit 72 provided on the subsequent stage of the first phase difference detecting unit 71, a difference between the frequency fine adjustment amount output from the parameter output unit 6 and the second phase difference detecting unit 71 is extracted. The extracted difference (frequency difference) is cumulatively added in a phase difference cumulative adding unit 73 and an addition result is supplied to a first D/A converting unit 80 via a loop filter 8. An analog voltage obtained in the D/A converting unit 80 as the control voltage is supplied to the voltage controlled oscillating unit 1 via a coupler 11. The phase difference cumulative adding unit 73 and the loop filter 8 correspond to a frequency difference integrating means in this example. Incidentally, 12 denotes a filter composed of a capacitor and a resistance, which has a role as a low-pass filter alleviating noise at a high frequency of the control voltage to be applied to the voltage controlled oscillating unit 1.

On the other hand, an output of the low-pass filter 7 is input to an AGC circuit unit 32, and the AGC circuit 32 calculates $I^2+Q^2$ of the vector $I+jQ$ obtained in the reverse rotation vector multiplying unit 5, and has a role of adjusting a ratio (gain) multiplied by the A/D converting unit 3 in the multiplying unit 30 based on the result of the arithmetic operation (amplitude information). That is, the AGC circuit unit 32 calculates a scalar quantity (length) of the vector $I+jQ$ obtained in the reverse rotation vector multiplying unit 5, and if the length (an amplitude value) is larger than a set value determined in advance, obtains a correction value of the gain in the multiplying unit 5 so as to correct its large amount, and conversely, if the amplitude value is smaller than the set value determined in advance, the AGC circuit unit 32 obtains a correction value so as to correct its small amount, and, for example, the AGC circuit unit 32 adds the correction value to the gain at that time to thereby adjust the gain. The reason why the gain is corrected in this manner is that, as illustrated in FIG. 4, in arithmetic operating the velocity of the rotation vector V whose velocity is reduced in the first phase difference detecting unit 71, when the length of the rotation vector V deviates from a set value, the correspondence relation between the length of $\Delta V$ and the phase difference $\Delta\phi$ is broken, and if the break is large, the PLL loop does not operate normally. In this manner, gain control is performed so that the above-described amplitude value is maintained at the set value.

Further, a correction value determining unit 33 has the correction value that is obtained in the AGC circuit unit 32 input thereto, and here, determines whether or not the correction value deviates from a set range, and outputs logic "H" to a lock/unlock determining unit 34 when determining that the correction value does not deviate from the range, and outputs logic "L" to the lock/unlock determining unit 34 when determining that the correction value deviates from the range.

Further, the above frequency synthesizer is designed so that a size of the control voltage to be input to the voltage controlled oscillating unit 1 is monitored by a monitoring means 9. The above monitoring means 9 is provided with a buffer amplifier 91 having the control voltage that is input to the voltage controlled oscillating unit 1 input thereto, an A/D converting unit 92 A/D converting an output voltage of the above buffer amplifier 91, and a level determining unit 93 determining whether or not a level of a digital signal obtained in the above A/D converting unit 92 falls within a set range determined in advance.

Figure 5:
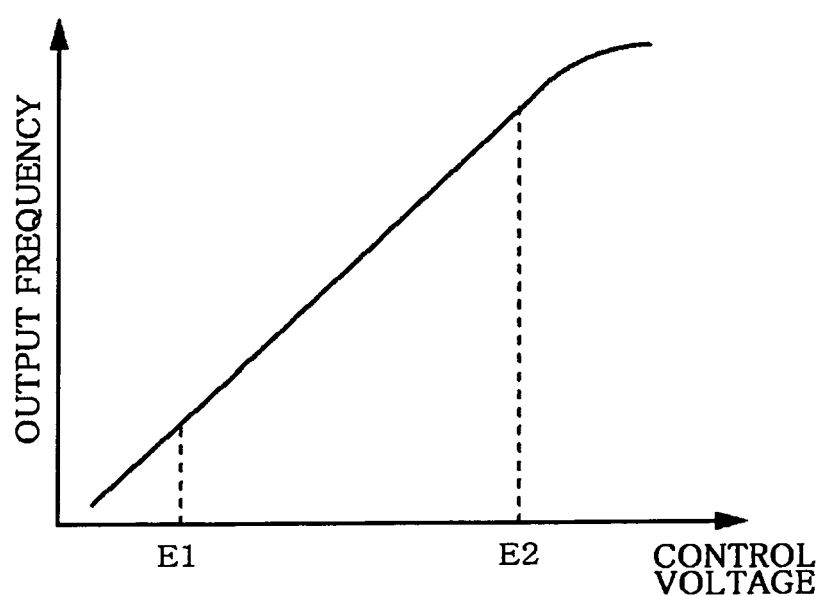
FIG. 5 is an explanatory chart illustrating a determination table in a lock/unlock determining unit.

FIG. 5 is a characteristic chart illustrating a relation between the control voltage to be input to the voltage controlled oscillating unit 1 and the output frequency, and when the above relation deviates from a straight line region, PLL control is brought into an abnormal state, resulting that the output frequency deviates from the set frequency. In order to avoid such an unlock state of the PLL, the control voltage between, for example, E1 and E2 is preferably used with a margin considered, and if the control voltage deviates from the range of E1 to E2, an unlock detection signal is output to disconnect, for example, the above frequency synthesizer from a system, and processing of switching to a frequency synthesizer on a redundant side or the like is required to be performed immediately. Thus, a signal level of the control voltage is designed to be detected by the monitoring means 9.

The level determining unit 94 outputs logic "H" to the lock/unlock determining unit 34 if the signal level is normal (falls within a set range), and outputs logic "L" to the lock/unlock determining unit 34 if the signal level is abnormal. Thus, determination signals from the above-described correction value determining unit 33 and determination signals from the monitoring means 9 are input to the lock/unlock determining unit 34, and as illustrated in FIG. 6, when an AND condition is established, a lock detection signal is output, and in the case when the AND condition is not established, namely in the case when one of the determination signals has logic "L", the unlock detection signal is output.

Further, the frequency synthesizer in the embodiment is provided with a frequency pull-in loop. In the above loop, as illustrated in FIG. 1, a second phase difference detecting unit 81, a switch unit 82, an integration circuit unit 83, and a second D/A converting unit 84 are provided. In the second phase difference detecting unit 81, an upper limit of an operable input value (the velocity of the rotation vector V) is set larger than an upper limit in the first phase difference detecting unit 71. Thus, the correspondence relation between a phase difference to be output from the second phase difference detecting unit 81 and the velocity of the rotation vector V is poor, but a role of that is to pull in the output frequency of the voltage controlled oscillating unit 1 to a range where the PLL loop operates normally, that is, to a range where the first phase difference detecting unit 71 operates normally, so that the setting does not cause a problem.

Then, on a subsequent stage of the integration circuit unit 83, a means for first supplying an initial voltage to the voltage controlled oscillating unit 1 as soon as the frequency synthesizer is started up is provided, which is not illustrated. By the above initial voltage, the frequency signal is output from the voltage controlled oscillating unit 1, and based on the output, the vector is also output from the reverse rotation vector multiplying unit 5. When the output is gradually increased, the second phase difference detecting unit 81 starts to operate, and an output from that is integrated in the integration circuit unit 83 to quickly raise the control voltage so that the velocity of the vector from the reverse rotation vector multiplying unit 5 is reduced to an operating range of the first phase difference detecting unit 71. While the series of initial frequency pull in is being performed, the switch 82 is switched to a contact point a side. Thereafter, a PLL lock is established, and then a contact point of the switch 82 is switched to a b side. At this time, no signal is supplied to the contact point b side from the parameter output unit 6. Incidentally, switching of the switch 82 is performed by monitoring, for example, an output value of the first D/A converting unit 80.

Further, the parameter output unit 6 monitors the output of the first D/A converting unit 80, and when the output value deviates from a set range, outputs a frequency pull-in signal to the contact point b side so that the above output value falls within the set range. For example, when the output value goes beyond the set range, a plus constant, which is, for example, +1, is output, and the above value is integrated in the integration circuit unit 83, and an integral value is added to the voltage from the first D/A converting unit 80 in the coupler 11. Accordingly, the control voltage is increased, so that the PLL loop operates in such a direction as to reduce the control voltage, resulting that an output value output from the second D/A is reduced to a set range.

Next, an operation of the above-described embodiment will be explained. First, the set frequency is input to the parameter output unit 6, and thereby a frequency divider ratio N in the frequency divider, the frequency of the reverse rotation vector V', and a value of a phase difference for adjustment that is supplied to the adding unit 72 are calculated. When the set frequency and the frequency divider ratio N are determined, a frequency fr of the rotation vector V obtained in the carrier remove 4 when the output frequency of the voltage controlled oscillating unit 1 becomes the set frequency is also found. The parameter output unit 6, among frequencies that are integral multiples of a frequency increment fa, calculates a frequency n·fa (n is an integer) closest to fr in advance to create a reverse vector reversely rotating at the frequency n·fa. Further, among integral multiples of a frequency increment fb for fine adjustment that is smaller than the above-described frequency increment fa, the parameter output unit 6 calculates a frequency m·fb (m is an integer) closest to a difference between fr and the above-described frequency n·fa to supply the calculated value as the phase difference for adjustment to the adding unit 72.

Then, when the frequency synthesizer is started up, the frequency is is pulled in from the frequency pull-in loop as described previously, and the control voltage of the voltage controlled oscillating unit 1 is raised until the first phase difference detecting unit 71 operates normally, which is, for example, until the PLL is locked. Incidentally, a frequency of a clock to be supplied to the A/D converting unit 3 is 40 MHz, and a frequency of the signal for detection that is supplied to the carrier remove 4 is 4 MHz.

When the PLL is locked, the scalar quantity of the rotation vector V whose velocity is reduced in the reverse rotation vector multiplying unit 5 is maintained at the set value, so that a correction amount of the gain obtained in the AGC circuit 32 falls within a set range. Further, the control voltage of the voltage controlled oscillating unit 1 also falls within a set range. Accordingly, the determination signals from both the correction value determining unit 33 and the level determining unit 94 have logic "H", and thus the lock detection signal is output from the lock/unlock determining unit 34. Here, when the PLL is locked, and then the control voltage of the voltage controlled oscillating unit 1 deviates from the set range, the signal of logic "L" is input to the lock/unlock determining unit 34 from the level determining unit 94, and the lock detection signal is output from the lock/unlock determining unit 34. When the scalar quantity of the rotation vector greatly deviates from the set value and thereby the correction amount of the gain obtained in the AGC circuit 32 deviates from the set range, the determination signal from the correction value determining unit 33 has logic "L" and the lock detection signal is output from the lock/unlock determining unit 34.

According to the above-described embodiment, monitoring the control voltage of the voltage controlled oscillating unit 1 makes it possible to detect the unlock state faster than the determination signals from the correction value determining unit 33 where the determination is performed through a step of obtaining the scalar quantity of the rotation vector V by the arithmetic operation. That is, the unlock state is detected based on an analog value, so that the detection of the unlock state is performed greatly fast as compared with the detection based on a digital value. Further, a determination result obtained after abnormality is determined based on the correction amount of the gain obtained in the AGC circuit unit 32 is also employed and the detection of the unlock state is performed twice, so that it is possible to quickly detect the unlock state with high reliability. Thus, when the frequency synthesizer operates abnormally, that is, in the case when switching to a redundant side as fast as possible or the like is required, the frequency synthesizer is a preferred device.

Here, a determining unit that determines whether or not the above-described amplitude value (scalar quantity of the rotation vector V) deviates from the set range instead of determining the abnormality based on the correction value obtained in the AGC circuit unit 32 and outputs logic "L" when the amplitude value deviates from the set range may also be provided in place of the correction value determining unit 33.

Then, also in the present invention, the voltage that the monitoring means 9 monitors is not limited to the one on the subsequent stage of the coupler 11, and it may also be an analog voltage obtained in the second D/A converting unit 84. As described previously, when the PLL lock is established, and then the analog voltage from the first D/A converting unit 80 deviates from a range set in advance, the voltage corresponding to the integral value of the constant output from the parameter output unit 82 is output from the second D/A converting unit 84 so that the PLL is not unlocked to thereby increase (or reduce) the control voltage of the voltage controlled oscillating unit 1. Thus, employing a structure in which what is called a compensation value of the control voltage being the analog voltage obtained in the second D/A converting unit 84 is monitored by the monitoring means 9 and more specifically, the input to the buffer amplifier 91 illustrated in FIG. 1 is taken in between the second D/A converting unit 84 and the coupler 11 also makes it possible to obtain a similar effect.

Furthermore, the voltage monitored by the monitoring means 9 may also be set to one on an input side of the A/D converting unit 3 instead of the ones in the examples. Also in the above case, the input voltage to the A/D converting unit 3 significantly changes, and when a signal level of the input voltage deviates from a set range determined in advance, logic "L" is output, and thereby the similar effect can be obtained. That is, the analog voltage is detected also in the above case, so that the unlock state can be quickly detected.

Further, the present invention is not limited to the one in which the unlock state is detected by using both the determination signals from the monitoring means 9 and the determination signals obtained based on the amplitude value obtained in the AGC circuit unit 32 or based on the correction value of the gain, and the present invention may also be designed so that the unlock state is detected by using only the determination result by the monitoring means 9. In the above case, the effect of enabling the quick unlock state detection is provided.

Incidentally, in the present invention, the frequency divider ratio N of the frequency divider 2 may also be "1", which is substantially equal to the case where the frequency divider is not used.

Explanation Of Reference Numeral
1 voltage controlled oscillating unit
11 coupler
2 frequency divider
3 A/D converting unit
31 reference clock generating unit
32 AGC circuit unit
33 correction value determining unit
34 lock/unlock determining unit
4 carrier remove
5 reverse vector arithmetic operating unit
6 parameter output unit
71 phase difference detecting unit
72 adding unit
73 phase difference cumulative adding unit
8 loop filter

The invention claimed is:
1. A frequency synthesizer, comprising:
a divide unit for dividing a frequency signal output from a voltage controlled oscillating unit depending on a control voltage to achieve a frequency divided signal;
an analog/digital converting unit for digitizing the frequency-divided frequency signal;
a vector extracting unit that quadrature-detects an output signal from the analog/digital converting unit using a digital sinusoidal detecting signal to extract a real part and an imaginary part of a complex expression of a rotation vector rotating at a frequency corresponding to a frequency difference between the output signal from the analog/digital converting unit and the digital sinusoidal detecting signal;
a frequency difference extracting unit for extracting a frequency difference between a first frequency of the rotation vector when the frequency of the frequency signal output from the voltage controlled oscillating unit becomes a set frequency and a second frequency of the rotation vector as extracted in the vector extracting unit;
an integrating unit for integrating values corresponding to a frequency difference extracted by the frequency difference extracting unit;
a digital/analog converting unit for converting output from the integrating unit to an analog signal to supply an integration result as the control voltage to the voltage controlled oscillating unit;
a monitoring unit that monitors the control voltage to be input to the voltage controlled oscillating unit; and
an output unit for determining whether a level of the control voltage monitored by said monitoring unit deviates from a set range determined in advance and outputting an unlock detection signal when the level deviates from the set range, wherein the vector extracting unit comprises:
- a first multiplying section for multiplying the output signal from the analog/digital by a first sinusoidal signal for detecting;
- a first low-pass filter provided at output side of the first multiplying section:
- a second multiplying section for multiplying the output signal from the analog/digital by a second sinusoidal signal for detecting, wherein the second sinusoidal signal is same as the frequency of the first sinusoidal signal and is difference from the phase of the first sinusoidal signal in the phase 90 degrees; and
- a second low-pass filter provided at output side of the second multiplying section.

2. The frequency synthesizer according to claim 1, wherein said monitoring unit monitors a signal level of an input signal to the analog/digital converting unit instead of monitoring the control voltage, and wherein said output unit determines whether the level of the input signal deviates from a set range determined in advance instead of determining whether the level of the control voltage deviates from the set range determined in advance.

3. The frequency synthesizer according to claim 1, further comprising:
- a frequency pull-in unit, when a PLL is locked and then the PLL is unlocked, adding a frequency pull-in voltage to an analog voltage from the digital/analog converting unit to supply an addition result as the control voltage to the voltage controlled oscillating unit, wherein said monitoring unit monitors the frequency pull-in voltage instead of monitoring the control voltage, and wherein said output unit determines whether a level of the frequency pull-in voltage deviates from a set range determined in advance instead of determining whether the level of the control voltage deviates from the set range determined in advance.

4. The frequency synthesizer according to claim 1, wherein said frequency difference extracting unit includes:
- a third multiplying section multiplying the rotation vector extracted in the vector extracting unit by a reverse rotation vector reversely rotating at a frequency determined in rough increments according to the set frequency;
- a phase difference detecting unit detecting a phase difference between the rotation vectors whose velocities are reduced by the third multiplying section in each sampling time; and
- a unit extracting a difference between a phase difference between rotation vectors rotating at a frequency equal to a difference between the frequency determined in rough increments and the set frequency in each sampling time and the phase difference detected in the phase difference detecting unit, and wherein a vector detecting unit detects a length of the rotation vector whose velocity is reduced, and an outputting correction signal unit outputs a correction signal for gain control based on the length of the rotation vector detected in the vector detecting unit, and a multiplying section positioned on a subsequent stage of the analog/digital converting unit multiplies the signal that is not yet quadranture-detected by the correction signal for gain control, and an abnormal signal output unit that outputs an abnormal signal when the detected length of the rotation vector or the correction signal for gain control deviates from a range set in advance are further included, and wherein said output unit is structured to output the unlock detection signal when at least one of a first state and a second state occurs, including the first state where the control voltage or the level of the input signal into the analog/digital converting unit that is monitored by said monitoring unit deviates from the set range determined in advance, and the second state where the abnormal signal is output by the an abnormal signal output unit.

* * * * *